Figure 1:
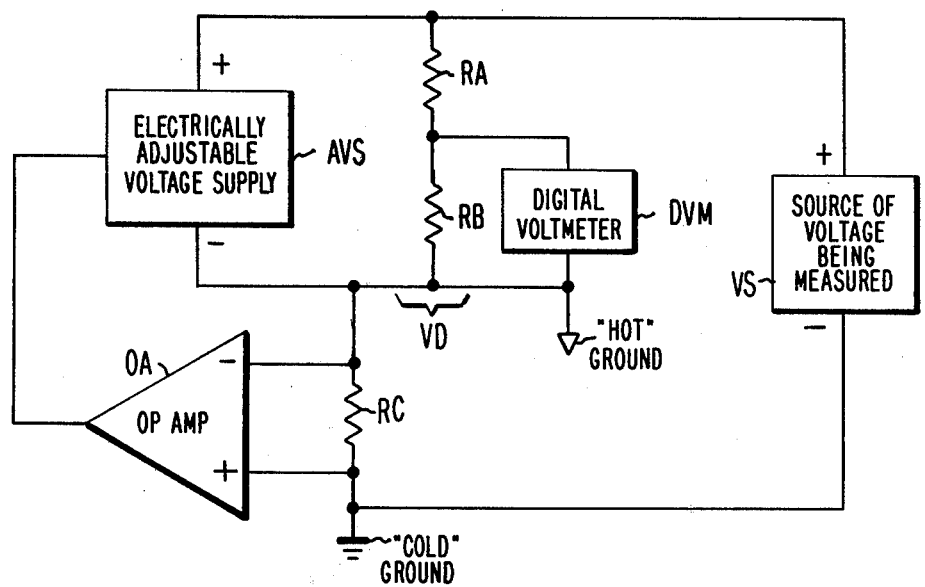

United States Patent [19]

Keller et al.

[11] 4,375,616
[45] Mar. 1, 1983

[54] NON-LOADING DIGITAL VOLTMETER

[75] Inventors: Scott C. Keller, Wrightsville; Linus C. Ruth, Lancaster, both of Pa.

[73] Assignee: RCA Corporation, New York, N.Y.

[21] Appl. No.: 186,339

[22] Filed: Sep. 11, 1980

[51] Int. Cl.³ .................... G01R 17/06; G01R 17/00
[52] U.S. Cl. .................................. 324/99 D; 324/98
[58] Field of Search .................... 324/98, 99 R, 99 D, 324/100, 126, 140

[56] References Cited

U.S. PATENT DOCUMENTS

| 2,011,315 | 8/1935 | Gilbert | 324/99 R |
| 2,059,786 | 11/1936 | Gilbert | 324/99 R |
| 3,281,832 | 10/1966 | Schwartz | |
| 3,566,265 | 2/1971 | Reid | 324/99 D |
| 3,701,014 | 10/1972 | Wang | 324/98 |
| 3,760,272 | 9/1973 | Battes | 324/111 |

Primary Examiner—Ernest F. Karlsen

Attorney, Agent, or Firm—Joseph S. Tripoli; Robert L. Troike; Allen L. Limberg

[57] ABSTRACT

A substantially non-loading circuit for measuring voltages in a range with relatively high upper limit uses a resistive voltage divider for scaling down these voltages for application to a digital voltmeter capable of measuring voltages in a range with relatively low upper limit. The loading that the input circuit of the resistive potential divider would place on the circuit being measured is reduced by placing the loading of the potential divider input circuit on an electrically adjustable voltage supply, rather than the circuit being measured. The current loading on the circuit being measured is sensed; and the output voltage of this supply is automatically adjusted by feedback to reduce the sensed circuit. In this way, loading of the circuit being measured is reduced, thus avoiding undesirable reduction of the voltage across the circuit owing to its being loaded.

2 Claims, 3 Drawing Figures

NON-LOADING DIGITAL VOLTMETER

The present invention relates to a substantially non-loading apparatus for measuring voltages.

This apparatus was developed for use in the measurement of kinescope voltages, where it is desired to apply focus voltages to the kinescopes that are a prescribed fraction of their ultor voltages. The measurement of the several kilovolt potentials involved has traditionally been carried out using electrostatic voltmeters, but these meters present the problems traditionally associated with the use of analog meters—e.g., the need to re-zero the meter frequently, the need to read the meter straight on to avoid parallax errors, and the need to take care in interpolating between scale gradations. In a production line it would be desirable, instead, to use a digital voltmeter, so that kinescope voltage readings can be made quickly and accurately by unskilled personnel.

Commercially available digital voltmeters are, however, only capable of reading voltages over ranges with upper limits that are considerably less than the twenty kilovolts or so upper limit that is desirable for reading a kinescope ultor potential. This suggests that potential division is necessary to develop voltages that are within the upper limit that can be handled by the digital voltmeter, with the digital voltmeter reading being scaled up to compensate for the voltage division. The problem with this approach is that a resistive voltage divider for this purpose loads the point at which voltage is being measured, tending to reduce the voltage at that point to cause an error in the reading of the digital voltmeter.

The present invention overcomes this problem by applying the output voltage of an electrically adjustable voltage supply across the resistive voltage divider. The current flow to the point at which voltage is being measured is monitored for generating an electric control signal that will adjust the output voltage of the electrically controlled supply to reduce this current flow to negligible level. The relatively low source impedance of the electrically adjustable voltage supply will then support the current flow through the resistive voltage divider, supposing source impedance of the point at which voltage is being measured to be relatively high, so this point is not appreciably loaded in order to support this current flow.

Figure 2:
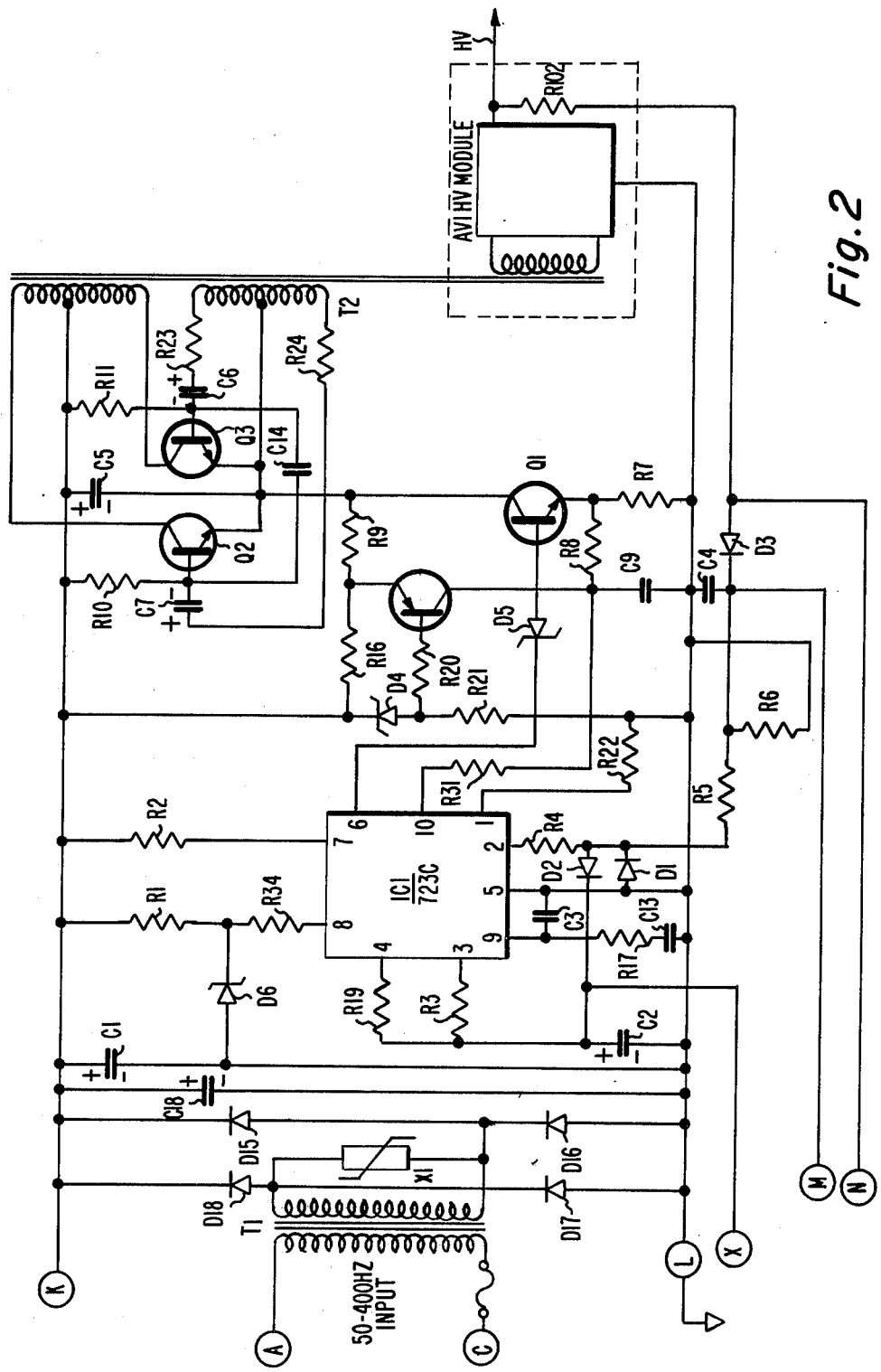
Figure 3:
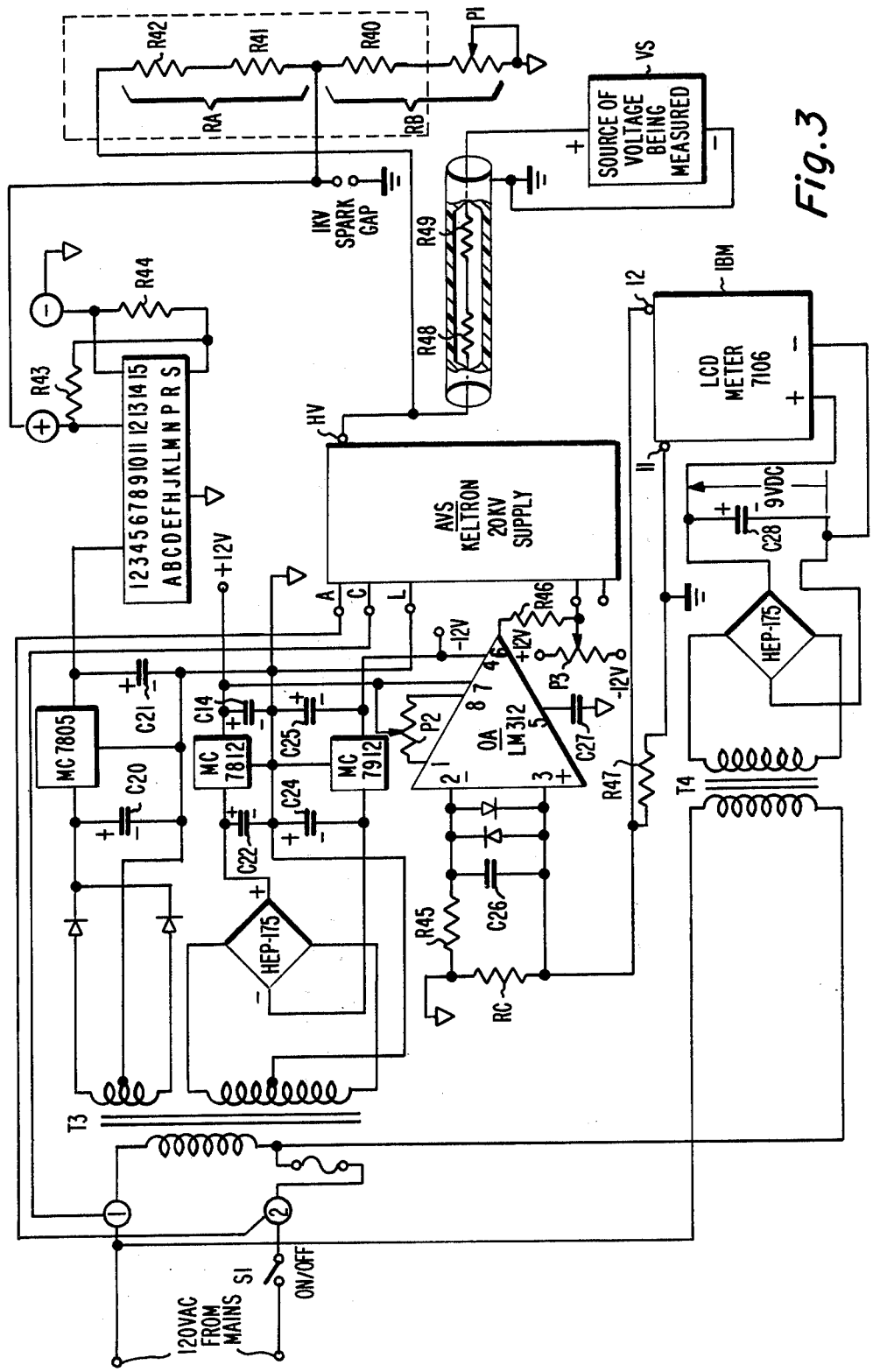

In the drawing:

FIG. 1 is a simplified schematic diagram, largely in block form, showing a non-loading apparatus for measuring voltages, which embodies the present invention;

FIG. 2 is a schematic diagram of a Keltron Corporation 20 kilovolt Model No. 81000860 modular high-voltage supply as modified to provide an electrically adjustable voltage supply for use in apparatus embodying the present invention; and FIG. 3 is a more detailed schematic of non-loading apparatus per the FIG. 1 block schematic using the modified Keltron Corporation high voltage power supply of FIG. 2.

In FIG. 1 the voltage to be measured, available from voltage source VS, is applied to the input circuit of a resistive voltage divider VD comprising resistances RA and RB in serial connection. The output circuit of voltage divider VD, across RB, is connected to the input circuit of the digital voltmeter DVM. The means for applying the voltage to be measured from source VS to the voltage divider VD includes a current sensing resistance RC, negligibly small in resistance compared to RA and RB.

An electrically adjustable voltage supply AVS has its output circuit, which offers relatively low source impedance, connected across the input circuit of voltage divider VD. The output voltage supplied by adjustable voltage supply AVS is adjusted responsive to the output voltage of an operational amplifier OA, which has current sensing resistance RC connected between its inverting and non-inverting input connections. If the output voltage appearing across the output circuit of voltage supply AVS is the same as the voltage to be measured, there will be no current flow via current sensing resistor RC to or from the source VS of voltage being measured. The potential drop across RC will be zero-valued, and the operational amplifier output will not act to change the output of voltage supply AVS. In the interest of highest accuracy of voltage measurement, where one knows the nominal value of the voltage to be measured as will be the case in repetitive product line measurements, it is desirable to adjust the direct coupling of the output circuit of operational amplifier OA to the control circuit of the adjustable voltage supply AVS, so that potential drop across RC is zero-valued at this nominal value.

If the output voltage of adjustable voltage supply AVS tends to exceed the voltage to be measured, current will tend to flow through RC in the direction from non-inverting input connection to inverting input connection of operational amplifier OA. The output connection of operational amplifier OA supplies a response to the control circuit of adjustable supply AVS which tends to reduce the output voltage of the supply. On the other hand, if the output voltage of adjustable voltage supply AVS tends to be less than the voltage to be measured, current will tend to flow through RC in the direction from inverting input connection to non-inverting connection of operational amplifier OA. Then, the output connection of operational amplifier OA supplies a response to the control circuit of adjustable voltage supply AVS which tends to increase its output voltage. In either case, the correction in the output voltage of adjustable voltage supply AVS tends to reduce its departure from the voltage being measured.

The non-inverting input connection of operational amplifier OA is considered to be connected to earth or "cold" ground signified by connection to the conventional ground symbol. Its inverting input connection is at substantially the same potential from the standpoint of a high voltage measurement and is considered to be connected at "hot" ground signified by connection to a triangle symbol. The use of these conventions considerably simplifies more detailed schematics such as that of FIG. 3.

FIG. 2 is the schematic diagram of a Model No. 81000860 twenty kilovolt modular high-voltage supply available from Keltron Corporation, 225 Crescent Street, Waltham, MA 02154. The alphanumerics used for element identification are those used by Keltron Corporation in their schematics. The apparatus at left of the capacitor C1 in FIG. 2 is a 24 volt d-c supply, transformer T1 being used to transform down 105–125 VAC mains voltage for rectification by a full-wave bridge connection of rectifiers D15, D16, D17, D18 for application to storage capacitor C18. IC1 is a voltage regulator integrated-circuit of the 723 generic type. It contains a differential-input error amplifier for comparing rectified high voltage output, as divided down and applied to its inverting input connection at pin 2, against a reference voltage applied to its non-inverting input connection at pin 3. An error signal related to the difference of these voltages is supplied from the output connection at pin 6 of this error amplifier to control the conduction of an NPN transistor Q1 serving as the controlled tail current supply of further NPN transistors Q2 and Q3 in long-tailed-pair connection with each other. Q2 and Q3 are further connected in a push-pull tickler-feedback oscillator arrangement, their collectors supplying the center-tapped primary winding of a transformer, the step-up secondary winding of which supplies the AV1 high voltage module. The tickler feedback for application to the bases of Q2 and Q3 is taken in balanced form from the ends of a center-tapped step-down tertiary winding of the transformer, which is tuned by capacitor C14 and has its center tap connected to the tail connection between the emitters of Q2 and Q3.

Suppose the direct high voltage output as coupled back to the inverting input connection of the IC1 error amplifier via resistor R102, diode D3, and resistors R5 and R4 exceeds the voltage at the non-inverting input connection of the IC1 error amplifier. Then the output connection of this error amplifier at pin 6 of IC1 will be reduced in voltage compared to that at "hot" ground connection L, to reduce the tail current demanded at the collector of Q1. This reduces the switched emitter currents of Q2 and Q3, reducing the oscillator output supplied to the AV1 high voltage module via transformer T2, thus reducing the high voltage output by degenerative feedback. On the other hand, too low a high voltage output when divided down, applied to pin 2 at the inverting connection of the IC1 error amplifier and compared to the voltage applied to pin 3 at the non-inverting input connection of this amplifier will cause the output connection at pin 6 of this amplifier to increase in voltage respective to "hot" ground at connection L. This causes Q1 to present an increased tail current demand at its collector, increasing the switched emitter currents of oscillator Q2 and Q3 and ultimately increasing high-voltage output.

Of particular interest to the present invention is the biasing of the non-inverting input connection at pin 4 of the error amplifier respective to "hot" ground connection L. An "on-chip" voltage reference in IC1 supplies a voltage at pin 4 that is applied via resistors R19 and R3 to pin 3 in the unmodified modular high voltage supply. To facilitate the present invention an additional component of biasing for pin 4 is afforded by current applied via a connection X to the interconnection of R19 and R3 to generate a potential drop component across R19 that adds to or subtracts from the potential supplied from the internal reference voltage supplied at pin 4 of IC1.

The remaining pin-out of IC1 is as follows. Pins 8 and 5 are positive and negative operating supply voltage connections, respectively. Pin 9 is for the frequency compensation connection of the primary roll-off capacitor Q3 for the error amplifier portion of IC1. Pins 10 and 1 serve for the current limit and current sense connections. Pin 4 is offset in potential from pin 5 by the sum of the voltages across a forward-conduction silicon junction and across another silicon junction reverse-biased into avalanche conduction; both junctions are located within IC1.

FIG. 3 shows more specifically the FIG. 1 circuitry as used with the modified Keltron 20 kV supply. The two 100 megohm resistors that comprise RA and the 200 kilohm fixed-value resistor in RB in the resistive voltage of divider VD are potted in water clear polyester casting resin made by Chemco, San Leandro, CA 94577, to reduce the risk of arc-over and for protection from dirt and humidity. Potentiometer P1 is used to adjust the voltage division ratio afforded by resistive voltage divider VD when calibrating the reading of the DVM respective to an electrostatic voltmeter standard. A 1 kV spark gap is disposed across the divider VD output circuit to lessen the hazards afforded by poor grounding. The case of the Keltron 20 kV supply is returned to "hot" ground. The digital voltmeter DVM used is a Model No. 2780-02R "Digitec" brand meter available from United Systems Corp., P.O. Box 458, Dayton, OH 45401.

The operational amplifier OA is a LM 312 manufactured by National Semiconductor, Microcircuits Division, 2900 Semiconductor Drive, Santa Clara, CA 85011. Of note is the low-pass filter comprising resistor R45 and capacitor C26 used to couple the current-sensing resistor RC to the input circuit of the operational amplifier OA to reduce its response to extraneous hum and noise.

Potentiometer P2 is a balance adjustment to offset the output voltage at pin 6 of OA when there is zero voltage drop across RC, so that the current through current-sensing resistor RC can be nulled at any value, in range, of the voltage being measured. When the voltage at pin 6 of OA goes up, the Keltron supply voltage goes down; and when the voltage at pin 6 goes down, the Keltron supply voltage goes up.

Potentiometer P3 limits the output voltage of supply AVS so that it cannot rise beyond a pre-set voltage, thus maintaining this voltage within the control range of OA.

A feature of interest is the current balance meter IBM with its terminals 11 and 12 connected for measuring the current between "hot" and "cold" grounds, which current is the loading imposed on the source VS of voltage being measured. In measuring picture tube voltages such as focus voltages on kinescopes it has been determined by corroboration with electrostatic voltmeter measurements that measurements with the apparatus of the present invention are accurate if the flow of current between "hot" and "cold" grounds does not exceed 50 nanoamperes. Current balance meter IBM offers at a glance confirmation as to whether or not the digital voltmeter DVM reading is acceptably accurate or not and indicates the presence of leakage currents which can be cancelled by means of potentiometer P2. Meter IBM is a Model No. 7106 LCD meter available from Intersil, Inc., 10710 No. Tantau Ave., MS37, Cupertino, CA 95014, in the units made to the present inventors' specifications and is powered by 9 VDC applied between its negative and positive power supply input terminals.

Resistors R48 and R49, are for limiting current flow from the voltmeter into the circuit being measured when the voltage supplied by the meter is higher than the voltage of the source being measured.

The design of the power supplies for the LM312 and for the current balance meter is conventional, the current balance meter having its own power supply to avoid ground-current problems that adversely affect the performance of the operational amplifier OA in its feedback loop connection. Transformer T3 is a MPC-Y-15 available from Signal Transformer Company, 500 Bayview Ave., Inwood, NY 11696; and transformer T4 is a conventional 6.3 VAC filament transformer. The HEP-175 bridge rectifier units and the MC 7805, MC 7812, and MC 7912 integrated-circuit voltage regulators are available from Motorola Semiconductor Products, Inc., 5005 E. McDonald Road, M370, Phoenix, AZ 85008.

The remainder of the parts in the FIG. 3 apparatus are per the following parts list.

| CAPACITORS | | |
|---|---|---|
| | C20 | 1000 μf, 16 VDC |
| | C21 | 50 μf, 6 VDC |
| | C22, C24 | 1000 μf, 25 VDC |
| | C14, C25 | 50 μf, 16 VDC |
| | C26 | 5 μf, 10 VDC Nonpolarized |
| | C27 | 1 μf, 50 VDC |
| | C28 | 500 μf, 15 VDC |
| RESISTORS | | |
| | RC | 330 Ω, ¼ W |
| | R40 | 200 KΩ, 1½ W |
| | R41, R42 | 100 MΩ, 10 W |
| | R43 | 10 MΩ, ½ W |
| | R44 | 100 kΩ, ½ W |
| | R45 | 5100 Ω, ¼ W |
| | R46 | 100 KΩ, ¼ W |
| | R47 | 100 KΩ, ¼ W |
| | R48, R49 | 22 MΩ, 1 W |
| POTENTIOMETERS | | |
| | P1, P2 | 25 KΩ, ¼ W |
| | P3 | 1 MΩ, ¼ W |

R41 and R42 are RLX-6 silicon-covered carbon resistors manufactured by American Components, Inc., Robinsville, NC 28771; and R43 is their ROX-¾ silicon-covered carbon resistor.

What is claimed is:

1. A substantially non-loading circuit for measuring voltages in a range with relatively high upper limit, comprising:

a voltmeter with an input circuit responsive to voltages applied to its input circuit to provide indications in digital form of that voltage, so long as those voltages are within a range with relatively low upper limit;

potential divider means for applying to the input circuit of said voltmeter a fraction of the potential appearing between first and second nodes, which potential divider means includes a first resistance with a first end at said first node and with a second end, and which includes a second resistance with a first end connected at the second end of said first resistance and with a second end connected at said second node, said second resistance connecting across the input circuit of said voltmeter;

means for applying the voltage to be measured between said first node and a third node;

current monitoring means connected for generating an electric control signal responsive to the polarity and amplitude of the flow of current between said second node and said third node; and electrically adjustable voltage supply means applying its output voltage, the value of which is adjusted responsive to said electric control signal, between said first and second nodes in such poling that a feedback loop is completed which reduces the flow of current through the input circuit of said current monitoring means, said electrically adjustable voltage supply means including a source of alternating-current voltage of relatively low amplitude controlled by said electric control signal, including a step-up transformer having a primary winding to which said alternating-current voltage of relatively low amplitude is applied and having a secondary winding at which an alternating-current voltage of relatively high amplitude consequently appears, and including a high voltage module for converting said relatively high amplitude alternating current voltage to a substantially direct voltage, the output voltage of said electrically adjustable voltage supply means.

2. A circuit as set forth in claim 1 wherein said current monitoring means comprises:

an operational amplifier having inverting and non-inverting input terminals connected at separate ones of said second and third nodes and having an output terminal from which said electric control signal is provided to said controlled source of alternating-current voltage; and a third resistance between said second and third nodes.

* * * * *

UNITED STATES PATENT AND TRADEMARK OFFICE
CERTIFICATE OF CORRECTION

PATENT NO. : 4,375,616

DATED : March 1, 1983

INVENTOR(S) : Scott Copley Keller et al.

It is certified that error appears in the above-identified patent and that said Letters Patent is hereby corrected as shown below:

Column 2, line 32, insert --voltage-- between "adjustable" and "supply"

Column 3, line 59, change "Q3" to --C3--.

Signed and Sealed this

Thirteenth Day of December 1983

[SEAL]

Attest:

GERALD J. MOSSINGHOFF

Attesting Officer     Commissioner of Patents and Trademarks